United States Patent
Nagano et al.

(10) Patent No.: US 9,809,953 B2
(45) Date of Patent: Nov. 7, 2017

(54) CONTROLLER ASSEMBLY AND WORK VEHICLE

(71) Applicant: KOMATSU LTD., Tokyo (JP)

(72) Inventors: Masahiro Nagano, Hirakata (JP); Makoto Sasaki, Takatsuki (JP); Yoshiaki Honma, Hirakata (JP)

(73) Assignee: KOMATSU LTD., Tokyo (JP)

( * ) Notice: Subject to any disclaimer, the term of this patent is extended or adjusted under 35 U.S.C. 154(b) by 0 days.

(21) Appl. No.: 15/022,942

(22) PCT Filed: Oct. 29, 2015

(86) PCT No.: PCT/JP2015/080594
§ 371 (c)(1),
(2) Date: Mar. 18, 2016

(87) PCT Pub. No.: WO2016/060280
PCT Pub. Date: Apr. 21, 2016

(65) Prior Publication Data
US 2017/0121936 A1 May 4, 2017

(51) Int. Cl.
*B60J 7/00* (2006.01)
*E02F 9/08* (2006.01)
(Continued)

(52) U.S. Cl.
CPC ........ *E02F 9/0808* (2013.01); *B60R 11/0264* (2013.01); *E02F 3/32* (2013.01);
(Continued)

(58) Field of Classification Search
CPC ..... C30B 13/00; C30B 29/60; A61G 2203/18; B60L 11/1805; B60R 11/0264;
(Continued)

(56) References Cited

U.S. PATENT DOCUMENTS 2,575,858 A * 11/1951 Bennett ............... F16F 1/54
188/268
2,951,674 A * 9/1960 Rice ............... F16F 1/3732
267/141.4
(Continued)

FOREIGN PATENT DOCUMENTS

DE 112013000586 T5 11/2014
DE 112013006454 B4 11/2015
(Continued)

*Primary Examiner* — Kiran B Patel
(74) *Attorney, Agent, or Firm* — Drinker Biddle & Reath LLP (57) ABSTRACT

A controller assembly is mounted on a side wall surface extending in an upward/downward direction of a hydraulic excavator. The controller assembly includes a controller main body, a first bracket, a second bracket, and a vibration suppressing member. The first bracket is mounted on the side wall surface described above. The second bracket is fixed to the controller main body. The vibration suppressing member supports the first bracket at one end in the upward/downward direction, and supports the second bracket at the other end in the upward/downward direction so as to be movable with respect to the first bracket.

10 Claims, 10 Drawing Sheets

(51) Int. Cl.
*E02F 9/20* (2006.01)
*E02F 3/32* (2006.01)
*E02F 9/16* (2006.01)
*B60R 11/02* (2006.01)
*F16F 15/02* (2006.01)

(52) U.S. Cl.
CPC .............. *E02F 9/16* (2013.01); *E02F 9/2004* (2013.01); *F16F 15/02* (2013.01)

(58) Field of Classification Search
CPC ...... B62D 5/097; B65H 2220/01; B65H 2220/02; H01L 2224/48227; H01L 2224/49171; G06K 19/07732; E02F 9/0808
USPC ..................................................... 296/190.01
See application file for complete search history.

(56) References Cited

U.S. PATENT DOCUMENTS

| | | | | |
|---|---|---|---|---|
| 2,952,430 A * | 9/1960 | Garman | ............... | F16M 7/00 248/606 |
| 3,866,977 A * | 2/1975 | Rice | ............... | B60B 3/04 181/207 |
| 4,354,067 A * | 10/1982 | Yamada | ............... | A61H 23/0236 381/301 |
| 4,437,653 A * | 3/1984 | Kakimoto | ............... | F16F 13/22 267/140.13 |
| 4,491,304 A * | 1/1985 | Kakimoto | ............... | F16F 13/22 248/659 |
| 4,676,473 A * | 6/1987 | Giles | ............... | F16F 15/08 248/316.6 |
| 4,779,853 A * | 10/1988 | Sugino | ............... | B60K 5/1241 180/300 |
| 5,145,037 A * | 9/1992 | Kobayashi | ............... | F16D 55/227 188/250 B |
| 5,178,374 A * | 1/1993 | Maeno | ............... | F16F 13/106 180/312 |
| 5,295,672 A * | 3/1994 | Gugsch | ............... | F16F 13/105 267/140.11 |
| 5,407,169 A * | 4/1995 | Tournier | ............... | F16F 13/26 248/562 |
| 5,499,799 A * | 3/1996 | Kojima | ............... | F16F 13/107 267/140.13 |
| 5,704,598 A * | 1/1998 | Kojima | ............... | F16F 13/10 267/140.13 |
| 5,799,930 A * | 9/1998 | Willett | ............... | B62D 24/02 267/141.4 |
| 5,810,322 A * | 9/1998 | Zhao | ............... | F25D 23/006 248/606 |
| 5,979,883 A * | 11/1999 | Mizutani | ............... | F16F 13/20 267/140.13 |
| 6,199,840 B1 * | 3/2001 | Yano | ............... | F16F 13/14 267/140.12 |
| 6,412,848 B1 * | 7/2002 | Ceccanese | ............... | B60K 35/00 224/311 |
| 6,435,487 B1 * | 8/2002 | Takaoka | ............... | F16F 13/107 267/140.11 |
| 6,557,839 B2 * | 5/2003 | Tanaka | ............... | F16F 13/107 267/140.13 |
| 7,017,891 B2 * | 3/2006 | Izabel | ............... | B60S 1/0416 267/141.4 |
| 7,246,797 B2 * | 7/2007 | Gustavsson | ............ | F16F 1/3713 267/139 |
| 7,458,565 B2 * | 12/2008 | Miyahara | ............... | F16F 1/3849 248/636 |
| 8,944,401 B2 * | 2/2015 | Guest | ............... | F16F 15/08 248/500 |
| 9,283,837 B1 * | 3/2016 | Rawlinson | ............... | H02K 5/04 |
| 9,327,773 B1 * | 5/2016 | Iwahashi | ............... | E02F 9/0858 |
| 9,388,874 B2 * | 7/2016 | Gustavsson | ............ | F16F 1/373 |
| 9,573,538 B2 * | 2/2017 | Sakamoto | ............ | B60R 16/0238 |
| 2005/0186092 A1 * | 8/2005 | Lee | ............... | F04B 39/0027 417/363 |
| 2007/0120301 A1 * | 5/2007 | Domen | ............... | F16F 1/3732 267/152 |
| 2011/0058318 A1 * | 3/2011 | Tsuchida | ............... | G11B 33/124 361/679.01 |
| 2014/0232130 A1 * | 8/2014 | Tanaka | ............... | E02F 9/16 296/24.3 |
| 2015/0283955 A1 * | 10/2015 | Sakamoto | ............ | F16B 5/0241 248/636 |
| 2016/0114737 A1 * | 4/2016 | Nagano | ............... | B60H 1/00378 62/244 |
| 2016/0186410 A1 | 6/2016 | Shioji et al. | | |

FOREIGN PATENT DOCUMENTS

| | | |
|---|---|---|
| JP | H01-143230 U | 10/1989 |
| JP | H09-144062 A | 6/1997 |
| JP | 2004-322777 A | 11/2004 |
| JP | 2005-146741 A | 6/2005 |
| JP | 2007-104814 A | 4/2007 |
| JP | 2009-005657 A | 1/2009 |
| JP | 2010-133184 A | 6/2010 |
| JP | 2014-114870 A | 6/2014 |
| JP | 2014-136951 A | 7/2014 |
| JP | 5538575 B1 | 7/2014 |
| JP | 2014-148872 A | 8/2014 |
| JP | 2015-013516 A | 1/2015 |

\* cited by examiner

CONTROLLER ASSEMBLY AND WORK VEHICLE

TECHNICAL FIELD

The present invention relates to a controller assembly and a work vehicle.

BACKGROUND ART

In recent years, a large number of machine controllers are mounted on a work machine along with advancement in functions.

Configurations and arrangements of such machine controllers are disclosed for example in Japanese Patent No. 5538575. In this publication, a placement plate is arranged on a bottom surface of a bracket having a U-shape in a side view through a vibration suppressing member, and the machine controllers are arranged on the placement plate. Since the vibration suppressing member provided between the bracket and the placement plate attenuates vibration, the controllers arranged on the placement plate are protected against acceleration of a vehicle.

CITATION LIST

Patent Document

PTD 1: Japanese Patent No. 5538575

SUMMARY OF INVENTION

Technical Problem

In the publication described above, the machine controllers are arranged behind an operator's seat. At this position, a plurality of controllers are centrally arranged, and the number of controllers is increased as compared to the conventional number along with advancement in functions of the hydraulic excavator. Therefore, there has been a problem that a space for arranging the controllers is decreased and it would be difficult to assemble or repair equipment.

Moreover, for example in a hydraulic excavator, vibrations in upward/downward direction are dominant. Therefore, it would be necessary to protect the machine controller from vibrations in the upward/downward direction.

The present invention was made in view of the problem described above, and its object is to provide a controller assembly and a work vehicle capable of being arranged in a small space in a lateral direction and effectively attenuating vibrations in the upward/downward direction.

Solution to Problem

A controller assembly of the present invention is a controller assembly mounted on a wall surface of a work vehicle extending in an upward/downward direction, and comprises a controller main body, a first bracket, a second bracket, and a vibration suppressing member. The first bracket is mounted on the wall surface described above. The second bracket is fixed to the controller main body. The vibration suppressing member supports the first bracket at one end in the upward/downward direction and supports the second bracket at the other end in the upward/downward direction such that the second bracket is movable with respect to the first bracket.

According to the controller assembly of the present invention, the first bracket is mounted on the wall surface extending in the upward/downward direction. Therefore, the controller main body can be mounted on the wall surface extending in the upward/downward direction through the first and second brackets.

Moreover, since the controller assembly can be mounted on the wall surface extending in the upward/downward direction, this controller assembly can be arranged in a small lateral space.

Moreover, the vibration suppressing member supports the first bracket at one end in the upward/downward direction and supports the second bracket at the other end in the upward/downward direction. Therefore, vibration of the second bracket in the upward/downward direction with respect to the first bracket can be effectively attenuated by means of the vibration suppressing member.

In the controller assembly described above, when a width direction is defined as a direction which is orthogonal to both an orthogonal direction orthogonal to the wall surface and the upward/downward direction, the vibration suppressing member is located in the width direction of the controller main body.

Accordingly, as compared to the case where the vibration suppressing member is arranged in the orthogonal direction of the controller main body described above, the size of the controller assembly in the orthogonal direction described above can be reduced. Therefore, the controller assembly can be arranged also in a region having a small space in the orthogonal direction described above.

In the controller assembly described above, the first bracket has a first boss portion and a first hole portion. The second bracket has a second boss portion and a second hole portion. The first boss portion extends toward one side in the upward/downward direction and penetrates through the second hole portion. The second boss portion extends toward the other side in the upward/downward direction and penetrates through the first hole portion.

Accordingly, at the time of assembling the first bracket and the second bracket, moving the second bracket relative to the first bracket toward the other side in the upward/downward direction allows the first boss portion of the first bracket to be inserted to the second hole portion of the second bracket and allows the second boss portion of the second bracket to be inserted to the first hole portion of the first bracket. Therefore, the first bracket and the second bracket can be readily assembled.

In the controller assembly described above, the first boss portion is located more on one side in the upward/downward direction than the second boss portion. A first vibration suppressing member fixation portion is provided at an end portion on the one side of the first boss portion. A second vibration suppressing member fixation portion is provided at an end portion on the other side of the second boss portion.

Since the first boss portion is located more on one side in the upward/downward direction than the second boss portion, the second boss portion is not located on one side of the first boss portion. Therefore, when the first vibration suppressing member fixation member is mounted on the first vibration suppressing member fixation portion at the end portion on one side of the first boss portion, the second boss portion does not interfere, so that the first vibration suppressing member fixation member can be readily mounted on the first vibration suppressing member fixation portion.

Moreover, the first boss portion is not located on the other side of the second boss portion. Therefore, when the second vibration suppressing member fixation member is mounted on the second vibration suppressing member fixation portion at the end portion on the other side of the second boss portion, the first boss portion does not interfere, so that the second vibration suppressing member fixation member can be readily mounted on the second vibration suppressing member fixation portion. Accordingly, the controller assembly can be readily assembled.

In the controller assembly described above, the first boss portion and the second boss portion are arranged so as to be concentric with each other.

Accordingly, as compared to the case where the first boss portion and the second boss portion are not arranged to be concentric, the controller assembly can be arranged in a smaller lateral space.

In the controller assembly described above, the controller main body includes a main body portion and a connector portion arranged at an upper end of the main body portion. Accordingly, in the state where the controller assembly is mounted on the wall surface extending in the upward/downward direction, operation of connecting a cable or the like to the connector portion can be readily performed.

In the controller assembly described above, the controller main body includes a main body portion and an indicator portion arranged at an upper portion of the main body portion. Accordingly, in the state where the controller assembly is mounted on the wall surface extending in the upward/downward direction, the indicator portion can be readily viewed.

In the controller assembly described above, when a width direction is defined as a direction which is orthogonal to both an orthogonal direction orthogonal to the wall surface and the upward/downward direction, a height size of the controller main body in the upward/downward direction is less than a width size of the controller main body in the width direction.

Accordingly, a height of the controller assembly can be suppressed. Therefore, when a window is arranged on a wall surface extending upward and downward, the controller assembly can be readily arranged below the window.

In the controller assembly described above, when a width direction is defined as a direction which is orthogonal to both an orthogonal direction orthogonal to the wall surface and the upward/downward direction, a width size of the controller main body in the width direction and a height size of the controller main body in the upward/downward direction are greater than a depth size of the controller main body in the orthogonal direction.

Accordingly, the controller assembly can be arranged in a small space in a depth direction.

In the controller assembly described above, when the controller main body is viewed from the orthogonal direction orthogonal to the wall surface, the first bracket has a wall surface mount hole at a position not overlapping with the controller main body.

Accordingly, after the controller is assembled, the wall surface mount hole can be utilized to mount the controller assembly on the wall surface extending in the upward/downward direction. Therefore, the operability to mount the controller assembly on the wall surface extending in the upward/downward direction is improved.

A work vehicle of the present invention includes any one of the controller assemblies described above and the wall surface extending in the upward/downward direction to which the controller assembly is mounted.

According to the work vehicle of the present invention, any one of the controller assemblies described above is mounted on the wall surface extending in the upward/downward direction. Therefore, the controller assembly can be arranged in a small lateral space, and vibration in the upward/downward direction applied to the controller assembly can be attenuated.

The work vehicle described above further includes an operator's seat. The controller assembly is arranged so as to be located at least in a region in the leftward/rightward direction of the operator's seat.

Accordingly, an operator seated on the operator's seat can readily view and handle the controller assembly.

The work vehicle described above further includes a cab and a work implement. The cab has an internal space in which the operator's seat and the controller assembly are arranged. The work implement is arranged on one side of the cab in the leftward/rightward direction. The controller assembly is arranged on the other side of the operator's seat in the leftward/rightward direction.

As described above, the work implement is arranged on one side of the cab in the leftward/rightward direction but is not arranged on the other side of the cab in the leftward/rightward direction. Therefore, a side surface of the cab on the other side in the leftward/rightward direction can be curved so as to protrude outwardly from the internal space in a plan view. Accordingly, since the internal space of the cab can be extended on the other side of the operator's seat in the leftward/rightward direction, the controller assembly can be readily arranged in the extended space.

Advantageous Effects of Invention

As described above, according to the present invention, a controller assembly and a work vehicle can be achieved which can be arranged in a small lateral space and which can effectively attenuate vibrations in the upward/downward direction.

DESCRIPTION OF EMBODIMENT

Hereinafter, an embodiment of the present invention will be described with reference to the drawings.

Figure 1:
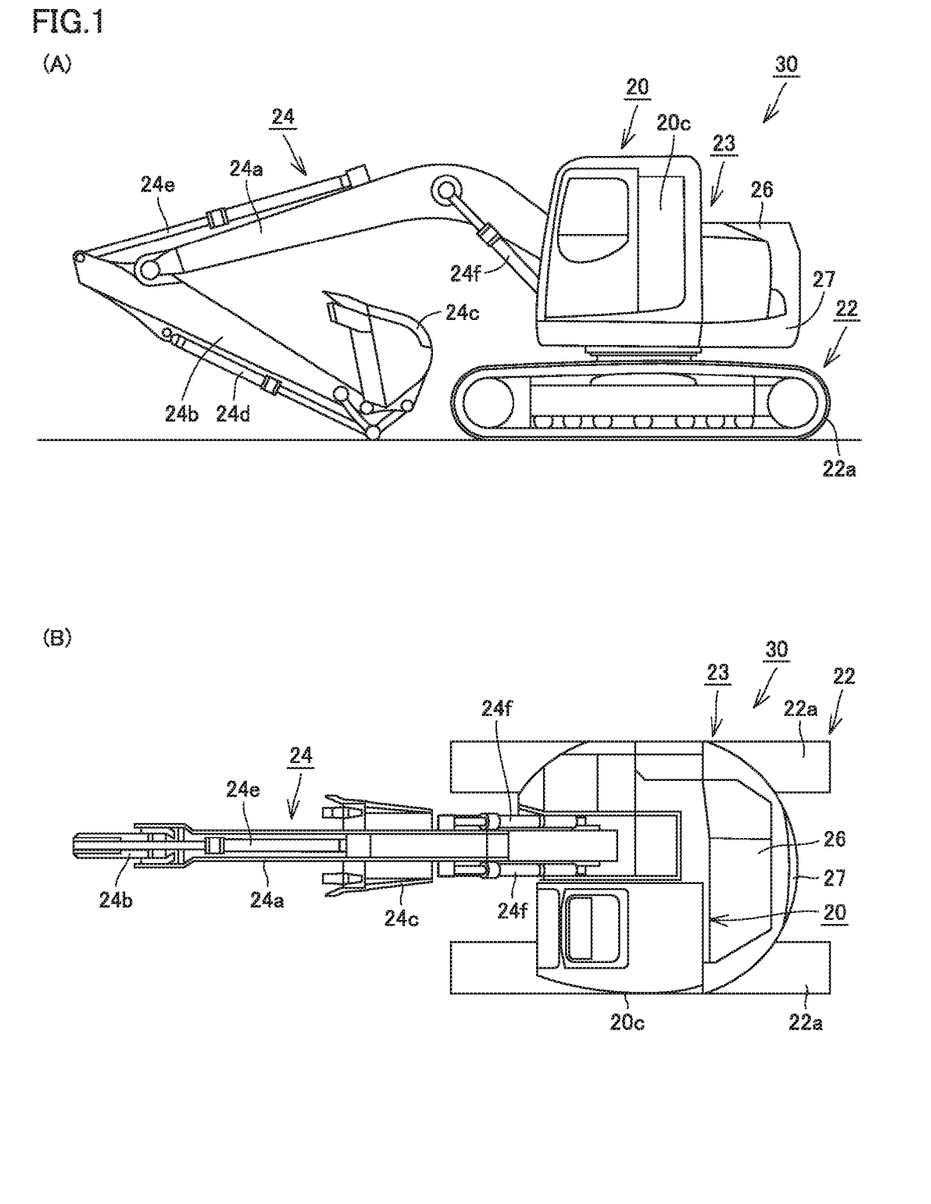
FIG. 1 represents a side view (A) and a plan view (B) schematically showing a configuration of a hydraulic excavator in accordance with one embodiment of the present invention.

Firstly, a configuration of a work vehicle in accordance with one embodiment of the present invention will be described. Hereinafter, a hydraulic excavator as one example of the work vehicle to which the idea of the present invention can be applied will be described with reference to FIGS. 1(A), 1(B), and 2. It should be noted that the present invention can applied also to work vehicles such as a bulldozer, a wheel loader, and the like other than a hydraulic excavator.

In the present example, a positional relation of each part will be described based on an operator seated on an operator's seat in a cab (operator's cab) 20 as a reference. A forward/backward direction is a forward/backward direction of an operator seated on the operator's seat. A leftward/rightward direction refers to a leftward/rightward direction of an operator seated on the operator's seat. An upward/downward direction refers to an upward/downward direction of an operator seated on the operator's seat.

A direction facing an operator seated on the operator's seat is a forward direction, and a direction opposite to the forward direction is a backward direction. The right side and left side at the time when an operator seated on the operator's seat faces the front side are a rightward direction and a leftward direction, respectively. A foot side of an operator seated on the operator's seat is a lower side, and a head side is an upper side.

Figure 2:
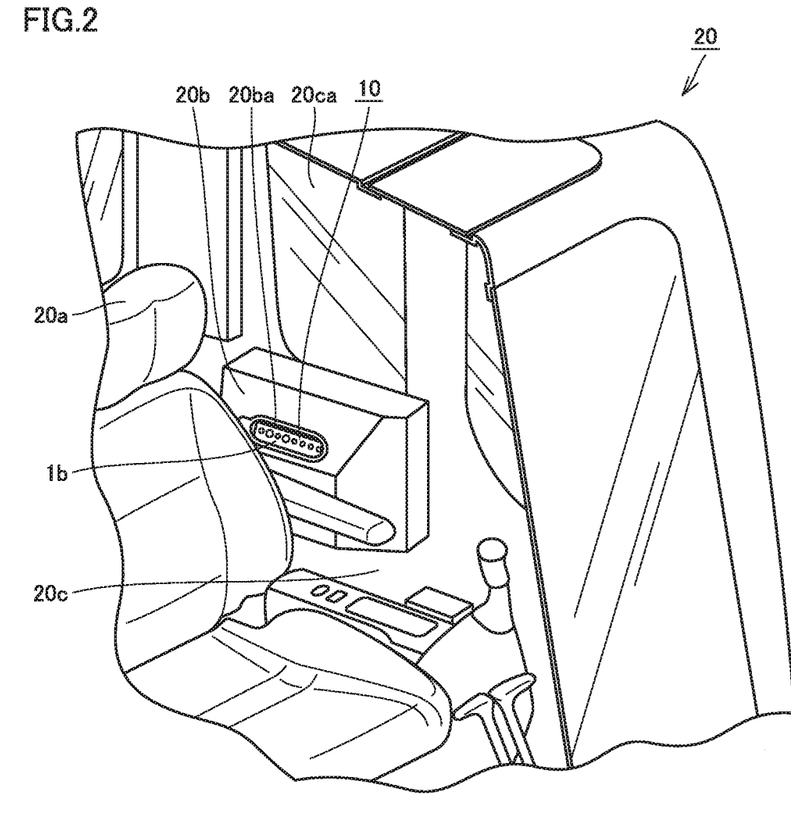
FIG. 2 is a partially broken enlarged perspective view representing inside of a cab of the hydraulic excavator of FIG. 1.

FIGS. 1(A) and 1(B) are a side view and a plan view schematically showing a configuration of the hydraulic excavator in accordance with one embodiment of the present invention. FIG. 2 is a partially broken enlarged perspective view representing inside of the cab of the hydraulic excavator of FIG. 1.

As shown in FIGS. 1(A) and 1(B), a hydraulic excavator 30 of the present embodiment is, for example, a hydraulic excavator of a super-short tail swing type. This hydraulic excavator 30 mainly has a travel unit 22, a revolving unit 23, and a work implement 24. Travel unit 22 and revolving unit 23 constitute a work vehicle main body.

Travel unit 22 has a pair of left and right crawler belt apparatuses 22a. Each of this pair of left and right crawler belt apparatus 22a has a crawler belt. Rotational driving of this pair of left and right crawler belt apparatus 22a allows hydraulic excavator 30 to be self-propelled.

Revolving unit 23 is installed so as to be freely revolvable with respect to travel unit 22. This revolving unit 23 mainly has a cab 20, an engine compartment 26, and a counterweight 27.

Cab 20 is arranged on a front left side (vehicle front side) of revolving unit 23. Each of engine compartment 26 and counterweight 27 is arranged on a rear side (vehicle back side) of revolving unit 23. Engine compartment 26 accommodates an engine unit (an engine, an exhaust gas processing structure, and the like). An upper side of engine compartment 26 is covered with an engine hood. Counterweight 27 is arranged on a rear side of engine compartment 26.

Work implement 24 is axially supported on a front side of revolving unit 23. Work implement 24 has, for example, a boom 24a, an arm 24b, a bucket 24c, hydraulic cylinders 24d, 24e, 24f, and the like. A base end of boom 24a is rotatably connected to revolving unit 23. Moreover, a base end of arm 24b is rotatably connected to a leading end of boom 24a. Bucket 24c is rotatably connected to a leading end of arm 24b. Boom 24a, arm 24b, and bucket 24c are driven by hydraulic cylinders 24d, 24e, 24f respectively, so that work implement 24 can be driven.

A reference for a positional relation of each part of the work vehicle is not limited to an operator seated on the operator's seat in cab 20. According to the hydraulic excavator of the present example, work implement 24 may be a reference. In such a case, the forward/backward direction is a direction in which work implement 24 extends from revolving unit 23 in a plan view. In the forward/backward direction, the side on which work implement 4 protrudes is the forward direction, and the side opposite to the forward direction is the backward direction. The direction which is orthogonal to the forward/backward direction in a plan view is the leftward/rightward direction. The right side and left side in the leftward/rightward direction when viewing in the forward direction are the rightward direction and the leftward direction, respectively. The upward/downward direction is a direction which is orthogonal to a flat plane determined by the forward/backward direction and the leftward/rightward direction. In the upward/downward direction, the side of the ground is the downward direction, and the side of the sky is the upward direction.

As shown in FIG. 2, an operator's seat 20a and a controller assembly 10 are mainly arranged in the internal space of cab 20. Operator's seat 20a is arranged on a floor of cab 20.

Cab 20 has a side wall surface 20c, as the wall surface extending in the upward/downward direction, located for example in the leftward/rightward direction of operator's seat 20a. For example, a side window 20ca is arranged on this side wall surface 20c.

Controller assembly 10 is mounted on side wall surface 20c. Controller assembly 10 is arranged directly below side window 20ca. This controller assembly 10 is covered with a protection cover 20b. Protection cover 20b is provided with an opening 20ba. An indicator portion 1b of controller assembly 10 can be viewed through this opening 20ba.

Next, a configuration of the controller assembly described above will be explained with reference to FIGS. 3 to 6.

Figure 3:
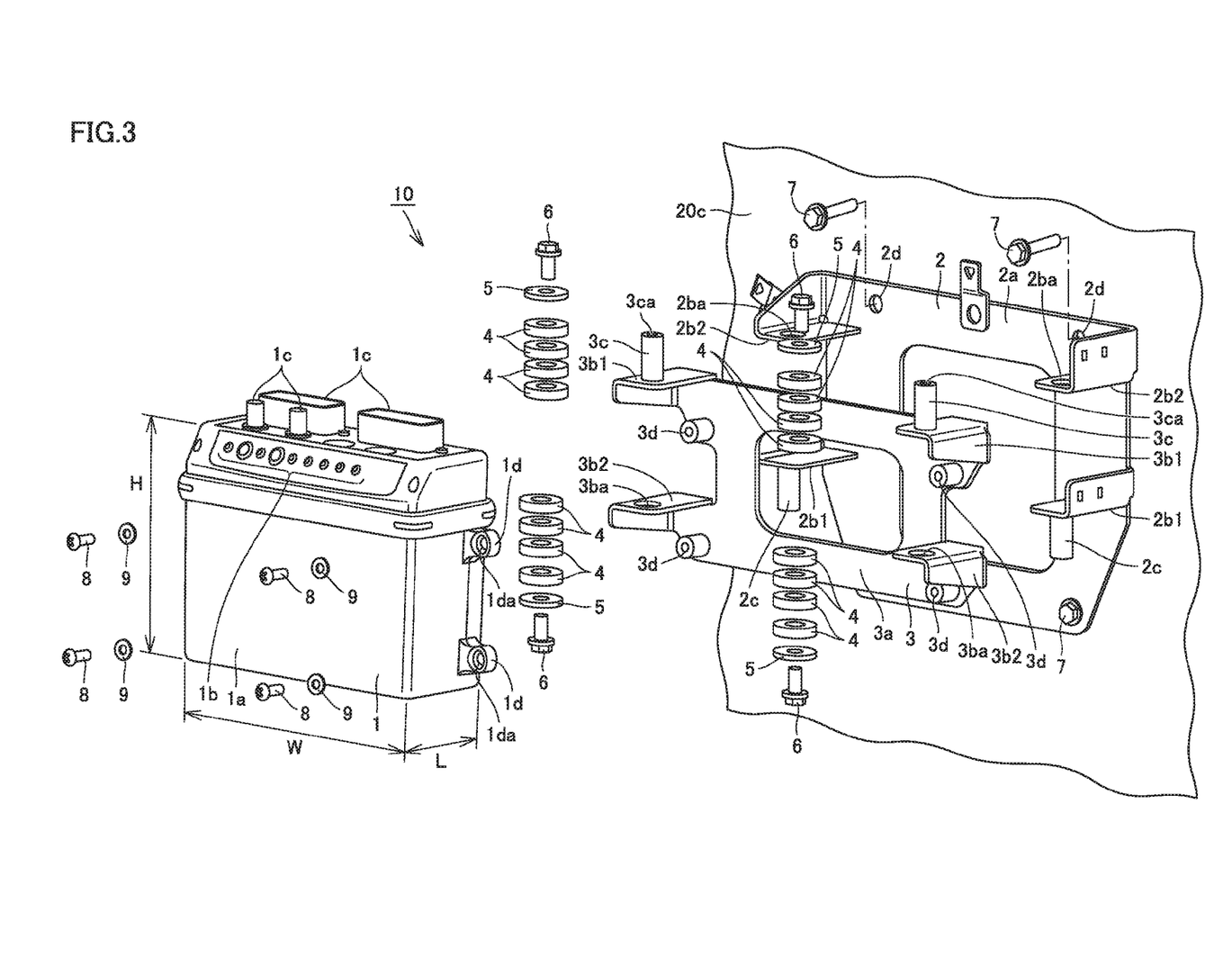
FIG. 3 is an exploded perspective view representing a configuration of a controller assembly in accordance with one embodiment of the present invention.
Figure 4:
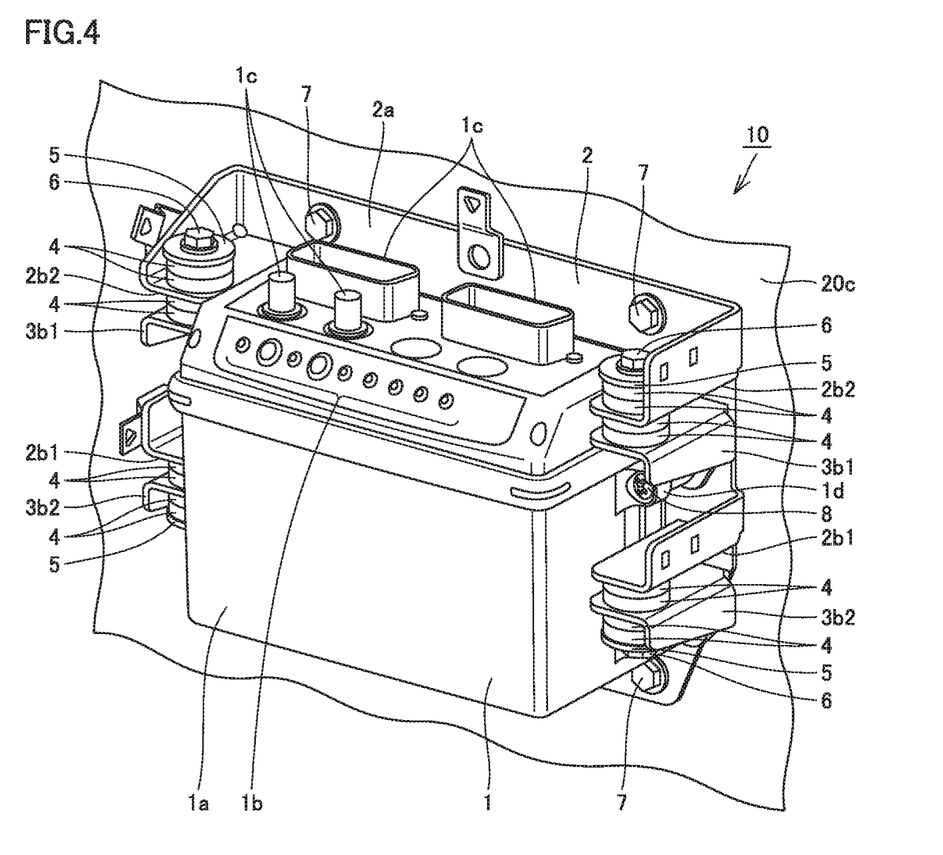
FIG. 4 is an assembled perspective view representing a configuration of the controller assembly in accordance with one embodiment of the present invention.
Figure 5:
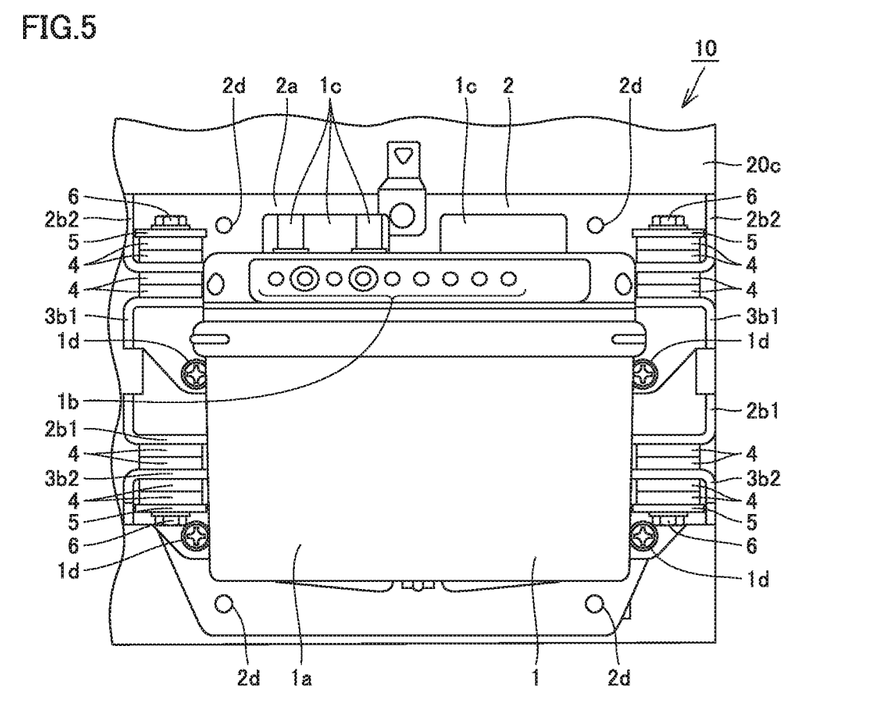
FIG. 5 represents a configuration of the controller assembly in accordance with one embodiment of the present invention, viewed from a direction orthogonal to a wall surface.
Figure 6:
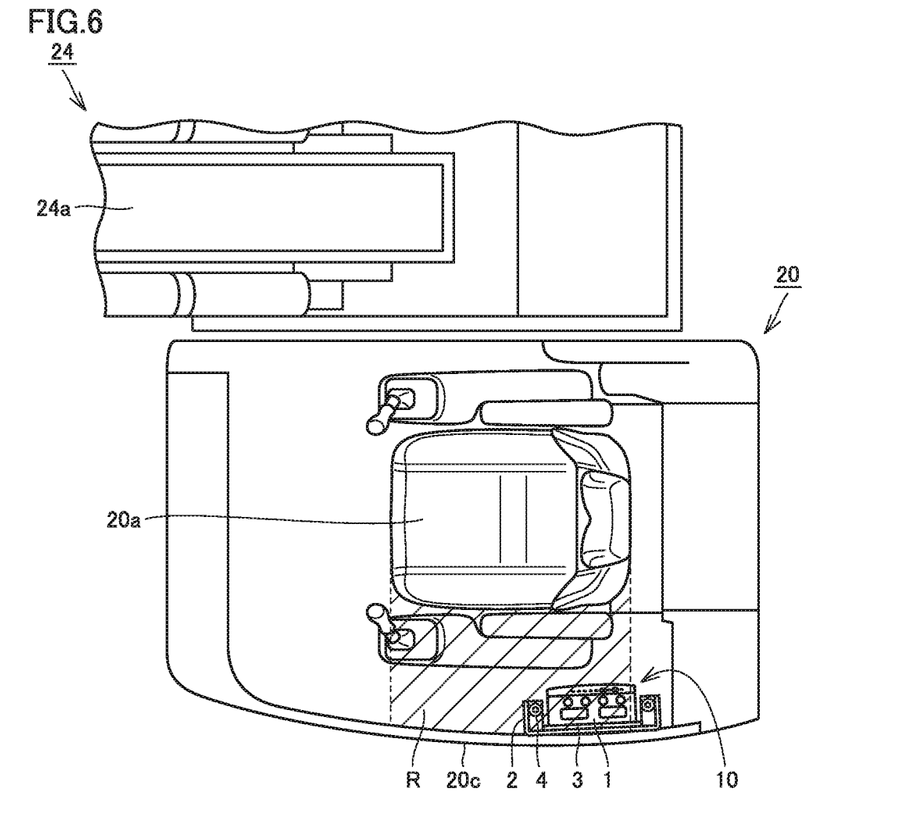
FIG. 6 is an enlarged plan view representing inside of a cab of the hydraulic excavator of FIG. 1.

FIGS. 3 and 4 are an exploded perspective view and an assembled perspective view representing a configuration of the controller assembly in accordance with one embodiment of the present invention. FIG. 5 represents a configuration of the controller assembly in accordance with one embodiment of the present invention viewed from a direction orthogonal to the wall surface. FIG. 6 is an enlarged plan view representing inside of the cab of the hydraulic excavator of FIG. 1.

As shown in FIGS. 3 and 4, controller assembly 10 mainly has a controller main body 1, a first bracket 2, a second bracket 3, and vibration suppressing members (elastic members) 4.

Controller main body 1 is, for example, adapted to process information of a work vehicle and position information of a work vehicle in an information-oriented construction system. Controller main body 1 has a main body portion 1a, an indicator portion 1b, a plurality of connector portions 1c, and a plurality of projecting fixation portions 1d.

Main body portion 1a has a substantially parallelepiped shape, and has a processing apparatus such as an MPU (Micro Processing Unit) therein. The plurality of connector portions 1c are portions for connecting cables and the like. The plurality of connector portions 1c are provided intensively on one surface of main body portion 1a. The plurality of connector portions 1c are preferably arranged on an upper end surface of main body portion 1a.

Indicator portion 1b has a plurality of display parts such as indication lamps. Indicator portion 1b is preferably arranged at an upper portion of main body portion 1a. Specifically, indicator portion 1b is provided on an inclined surface which is adjacent to the upper end surface of main body portion 1a. This inclined surface is angled with an obtuse angle with respect to the upper end surface.

Projecting fixation portion 1d projects sideward from each of two side surfaces intersecting with side wall surface 20c among four side surfaces of main body portion 1a. Projecting fixation portion 1d is provided with a through hole 1da into which a fixation member such as a bolt is inserted.

On one side surface of main body portion 1a, two projecting fixation portions 1d are provided. Two projecting fixation portions 1d provided on one side surface of main body portion 1a are arranged to be apart from each other in the upward/downward direction.

First bracket 2 mainly has a mounting portion 2a, supporting portions 2b1, 2b2, and boss portions 2c. Mounting portion 2a is a member which is mounted on side wall surface 20c extending in the upward/downward direction of the work vehicle. Mounting portion 2a is constituted of a flat plate extending along side wall surface 20c and has wall surface mount holes 2d. For example, a bolt 7 is inserted to wall surface mount hole 2d and screwed on side wall surface 20c, so that mounting portion 2a is mounted on side wall surface 20c.

Each of supporting portions 2b1, 2b2 is formed integrally with mounting portion 2a from one plate member. Each of supporting portions 2b1, 2b2 extends substantially perpendicularly from mounting portion 2a on a side opposite to side wall surface 20c. Supporting portions 2b1 are located on a lower side than supporting portions 2b2.

Two supporting portions 2b1 are provided respectively on one end side and the other end side in the width direction of mounting portion 2a. Moreover, two supporting portions 2b2 are also provided respectively on one end side and the other end side in the width direction of mounting portion 2a. It should be noted that the width direction is a direction which is orthogonal to both the orthogonal direction (depth direction) orthogonal to side wall surface 20c and the upward/downward direction.

Boss portion 2c (first boss portion) is mounted on supporting portion 2b1. Boss portion 2c has a circular cylindrical shape, for example. Boss portion 2c is mounted at its upper end on supporting portion 2b1 and extends downward from supporting portion 2b1. At a lower end surface of boss portion 2c, there is provided a female screw portion as a first vibration suppressing member fixation portion.

A through hole 2ba (first hole portion) is provided at supporting portion 2b2. Through hole 2ba penetrates through supporting portion 2b2 in the upward/downward direction. Through hole 2ba has, for example, a circular shape, and a diameter of the circular shape is greater than an outer diameter of boss portion 3c having a circular cylindrical shape.

Second bracket 3 mainly has a fixation portion 3a, supporting portions 3b1, 3b2, and boss portions 3c. Fixation portion 3a is a portion to which controller main body 1 is fixed. Fixation portion 3a has a flat plate portion and projection portions 3d. Projection portion 3d projects from its flat plate portion toward a side opposite to side wall surface 20c. A female screw portion is provided at a leading end surface of projection portion 3d.

Controller main body 1 is fixed to projection portions 3d. Specifically, bolts 8 are inserted through washers 9 to through holes 1da of projecting fixation portions 1d of controller main body 1 and screwed on the female screw portions of projection portions 3d.

Each of supporting portions 3b1, 3b2 is formed integrally with fixation portion 3a from one plate member. Each of supporting portions 3b1, 3b2 extends substantially perpendicularly from fixation portion 3a toward a side opposite to side wall surface 20c. Supporting portions 3b1 are located on an upper side than supporting portions 3b2.

Two supporting portions 3b1 are provided respectively on one end side and the other end side in the width direction of fixation portion 3a. Moreover, two supporting portions 3b2 are also provided respectively on one end side and the other end side in the width direction of fixation portion 3a.

Boss portions 3c (second boss portions) are mounted on supporting portions 3b1. Boss portion 3c has a circular cylindrical shape, for example. Boss portion 3c is mounted at its lower end to supporting portion 3b1 and extends upward from supporting portion 3b1. On an upper end surface of boss portion 3c, there is provided a female screw portion 3ca as a second vibration suppressing member fixation portion.

A through hole 3ba (second hole portion) is provided at supporting portion 3b2. Through hole 2ba penetrates through supporting portion 3b2 in the upward/downward direction. Through hole 3ba has, for example, a circular shape, and a diameter of the circular shape is greater than an outer diameter of boss portion 2c having a circular cylindrical shape.

Boss portion 2c extends downward from supporting portion 2b1 and penetrates through through hole 3ba of supporting portion 3b2. Two elastic members 4, supporting portion 3b2, and two elastic members 4 are fitted to boss portion 2c in this order. In the state where these members 4, 3b2 are fitted to boss portion 2c, bolt 6 is screwed through washer 5 to the female screw portion of boss portion 2c from a lower side.

Boss portion 3c extends upward from supporting portion 3b1 and penetrates through through hole 2ba of supporting portion 2b2. Two elastic members 4, supporting portion 2b2, and two elastic members 4 are fitted to boss portion 3c in this order. In the state where these members 4, 2b2 are fitted to boss portion 3c, bolt 6 is screwed through washer 5 to the female screw portion of boss portion 3c from an upper side. Boss portion 2c and boss portion 3c are arranged so as to be concentric with each other.

Each of the plurality of elastic members 4 has a circular ring shape or a cylindrical shape having a through hole at a center. The plurality of elastic members 4 are mounted to boss portion 2c or boss portion 3c by inserting boss portion 2c or boss portion 3c having a circular cylindrical shape in the through hole of elastic member 4. Elastic member 4 is made of, for example, rubber or the like.

Vibration suppressing members 4 are constituted of, for example, two elastic members 4 arranged between supporting portion 2b1 and supporting portion 3b2. Vibration suppressing members 4 arranged between supporting portion 2b1 and supporting portion 3b2 come in contact with supporting portion 2b1 at its upper end to support first bracket 2 through supporting portion 2b1. Moreover, vibration suppressing members 4 arranged between supporting portion 2b1 and supporting portion 3b2 come in contact with supporting portion 3b2 to support second bracket 3 through supporting portion 3b2.

Moreover, vibration suppressing members 4 are constituted of, for example, two elastic members 4 arranged between supporting portion 3b2 and washer 5. Vibration suppressing members 4 arranged between supporting portion 3b2 and washer 5 come in contact with supporting portion 3b2 at its upper end to support supporting portion 3b2. Moreover, vibration suppressing members 4 arranged between supporting portion 3b2 and washer 5 come in contact with washer 5 at its lower end.

Vibration suppressing members 4 are constituted of, for example, two elastic members 4 arranged between supporting portion 3b1 and supporting portion 2b2. Vibration suppressing members 4 arranged between supporting portion 3b1 and supporting portion 2b2 come in contact with supporting portion 2b2 at its upper end to support first bracket 2 through supporting portion 2b2. Moreover, vibration suppressing members 4 arranged between supporting portion 3b1 and supporting portion 2b2 come in contact with supporting portion 3b1 at its lower end to support second bracket 3 through supporting portion 3b1.

Moreover, vibration suppressing members 4 are constituted of, for example, two elastic members 4 arranged between supporting portion 2b2 and washer 5. Vibration suppressing members 4 arranged between supporting portion 2b2 and washer 5 come in contact with supporting portion 2b2 at its lower end to support supporting portion 2b2. Moreover, vibration suppressing members 4 arranged between supporting portion 2b2 and washer 5 come in contact with washer 5 at its upper end.

Vibration suppressing member 4 described above is adapted to attenuate vibrations inputted to hydraulic excavator 30 and cab 20 and prevent amplification of vibrations to reduce vibrations of controller main body 1. By means of vibration suppressing members 4 described above, second bracket 3 is supported on first bracket 2 so as to attenuate vibrations in the upward/downward direction. By means of vibration suppressing members 4 described above, second bracket 3 is supported on first bracket 2 so as to be movable only in the upward/downward direction.

Each of the plurality of elastic members 4 has a circular ring shape or a cylindrical shape having a through hole at a center. The plurality of elastic members 4 are mounted to boss portion 2c or boss portion 3c by inserting boss portion 2c or boss portion 3c having a circular cylindrical shape in the through holes of elastic members 4. Elastic members 4 are made of rubber or the like.

As shown in FIG. 3, a height size H of the controller main body in the upward/downward direction is less than a width size W of controller main body 1 in the width direction. Moreover, width size W of controller main body 1 and height size H of controller main body 1 are greater than a depth size L of controller main body 1 in a direction orthogonal to side wall surface 20c.

As shown in FIG. 5, vibration suppressing member (elastic member) 4 is located in the width direction of controller main body 1. Moreover, when controller main body 1 is viewed from the direction orthogonal to side wall surface 20c, first bracket 2 has wall surface mount hole 2d at a position not overlapping with controller main body 1. Specifically, when controller main body 1 is viewed from the direction orthogonal to side wall surface 20c, first bracket has wall mount hole 2d at a position on an upper side or a lower side of controller main body 1. This wall surface mount hole 2d may be located on an outer side than controller main body 1 in the width direction as long as it is a position not overlapping with controller main body 1 when controller main body 1 is viewed from the direction orthogonal to side wall surface 20c. It should be noted that illustration of bolt 7 inserted into wall surface mount hole 2d is omitted for ease of description in FIG. 5.

As shown in FIG. 6, in a plan view, controller assembly 10 is arranged so as to be located at least in a region R (the hatched region in the drawing) in the leftward/rightward direction of operator's seat 20a. When a part of controller assembly 10 is located within region R in the leftward/rightward of operator's seat 20a, other portions of controller assembly 10 may be located outside of region R.

In a plan view, when work implement 24 is located on one side (for example, the right side) of cab 20 in the leftward/rightward direction, controller assembly 10 is preferably located on the other side (for example, the left side) of operator's seat 20a in the leftward/rightward direction.

When determining a shape of side wall surface 20c of cab 20 on a side opposite to the side where work implement 24 is located in a plan view, it would not be necessary to consider interference with work implement 24. Therefore, side wall surface 20c of cab 20 can be curved so as to protrude from the internal space of cab 20 to an outer space in a plan view.

Particularly, when hydraulic excavator 30 is of a supershort tail swing type as shown in FIG. 1(B), the shape of side wall surface 20c of cab 20 is formed to have the curved shape described above.

As shown in FIG. 6, the shape of side wall surface 20c of cab 20 is curved as described above, so that an internal space of cab 20 can be extended on the other side of operator's seat 20a in the leftward/rightward direction. Therefore, by arranging controller assembly 10 within the extended space, controller assembly 10 can be readily arranged in cab 20.

Next, a method for mounting the above-described controller assembly to side wall surface 20c extending in the upward/downward direction will be described with reference to FIGS. 7 to 9.

Figure 7:
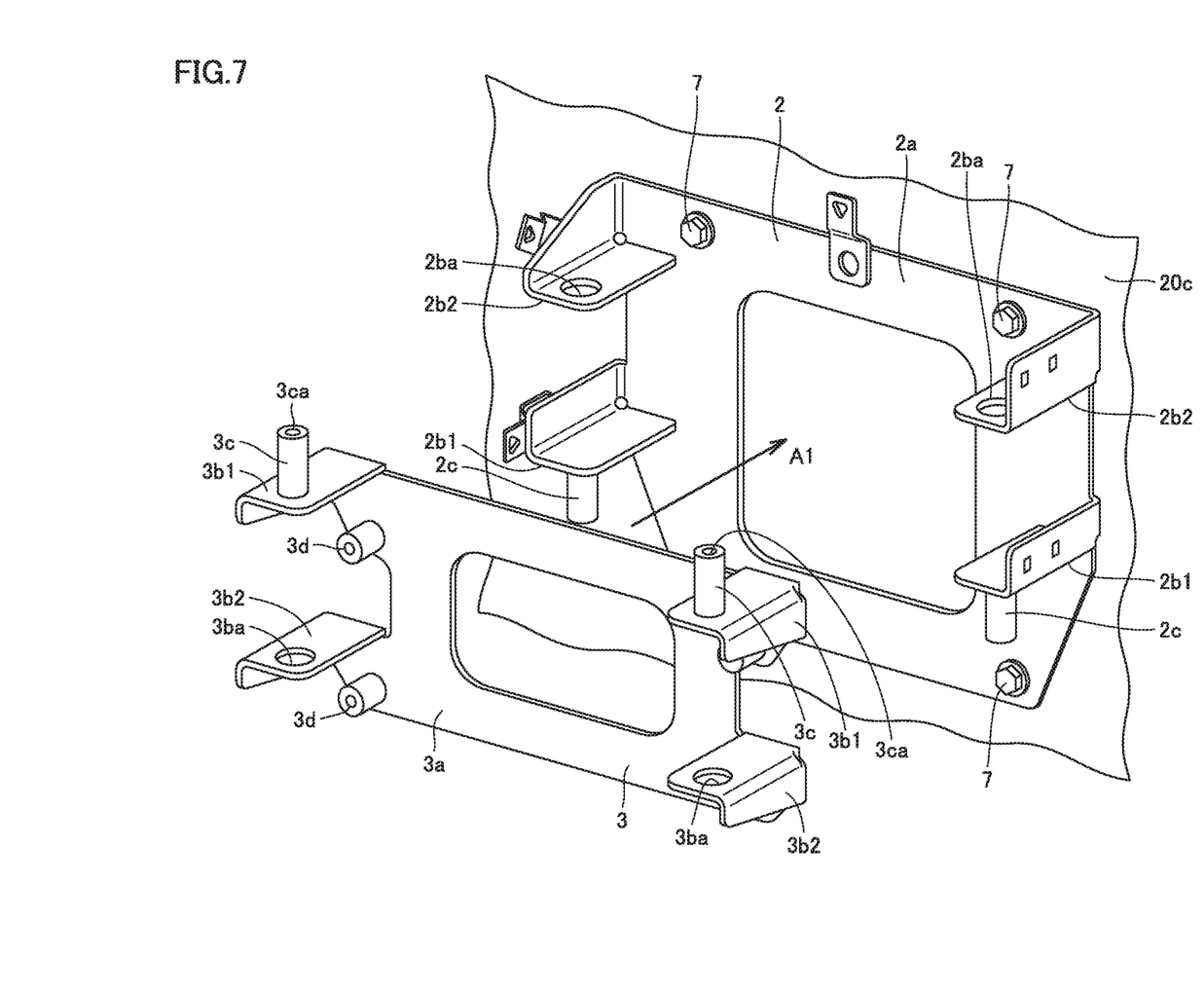
FIG. 7 is a schematic perspective view representing the first step of a method for mounting the controller assembly on a wall surface extending in the upward/downward direction in accordance with one embodiment of the present invention.
Figure 8:
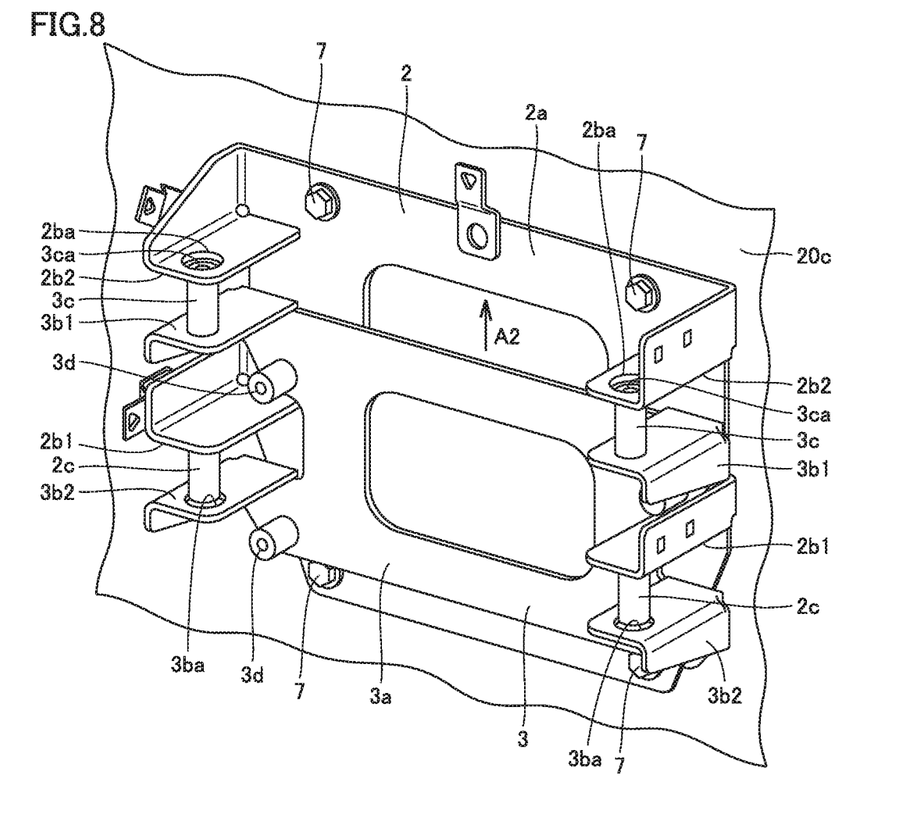
FIG. 8 is a schematic perspective view representing the second step of the method for mounting the controller assembly on the wall surface extending in the upward/downward direction in accordance with one embodiment of the present invention.
Figure 9:
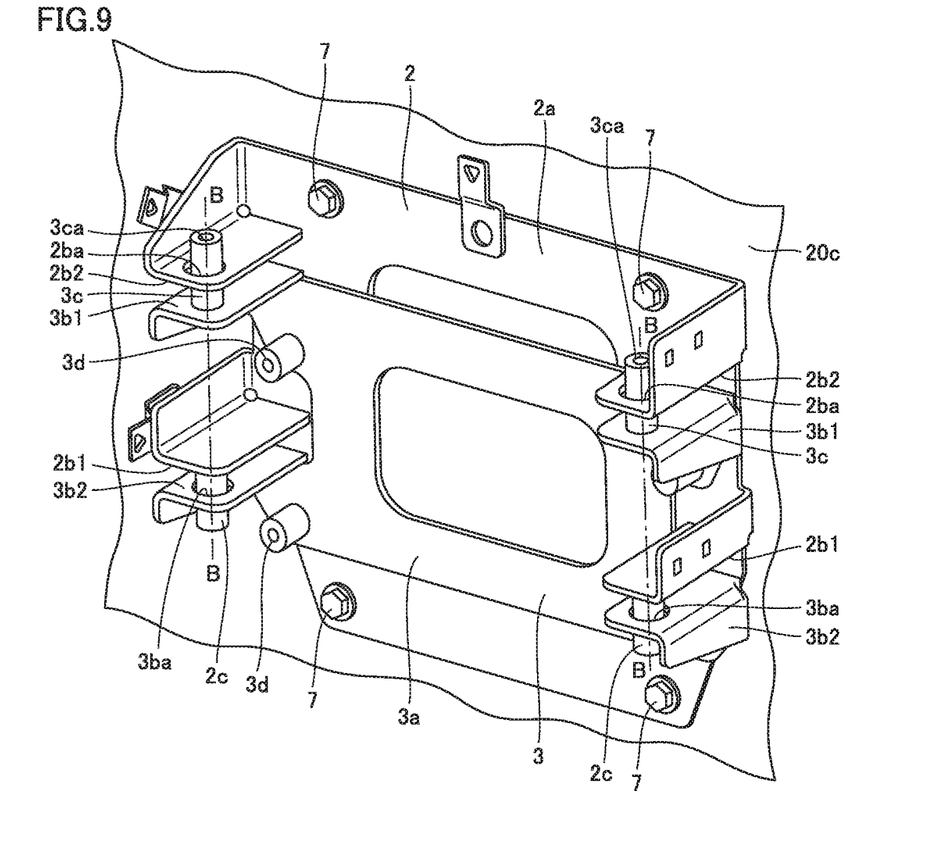
FIG. 9 is a schematic perspective view representing the third step of the method for mounting the controller assembly to the wall surface extending in the upward/downward direction in accordance with one embodiment of the present invention.

FIGS. 7 to 9 are schematic perspective views representing the method for mounting the controller assembly to the side wall surface extending in the upward/downward direction in accordance with one embodiment of the present invention. It should be noted that, in FIGS. 7 to 9, illustration of controller main body 1, elastic members 4, bolts 6, 8, and washers 5,9 is omitted for ease of description.

As shown in FIG. 7, first bracket 2 is mounted to side wall surface 20c of the work vehicle by means of bolts 7. In this state, supporting portions 2b1 of first bracket 2 are located below supporting portion 2b2. Moreover, boss portions 2c connected to supporting portions 2b1 extend downward from supporting portions 2b1.

On the other hand, the controller main body (not shown) is fixed to second bracket 3. In this state, supporting portions 3b1 of second bracket 3 are located above 3b2. Moreover, boss portions 3c connected to supporting portions 3b1 extend upward from supporting portions 3b1.

After that, second bracket 3 is moved along the depth direction of controller main body 1 as indicated by an arrow A1 in the drawing. Accordingly, second bracket 3 comes close to first bracket 2.

As shown in FIG. 8, the movement of second bracket 3 in the depth direction described above causes boss portions 3c to be arranged directly under through holes 2*ba* and causes boss portions 2*c* to be arranged directly above through holes 3*ba*.

In this state, supporting portions 3*b*1 and boss portions 3*c* of second bracket 3 are located between supporting portions 2*b*1 and supporting portions 2*b*2 of first bracket 2. To attain such a state, a space between supporting portion 2*b*1 and supporting portion 2*b*2 of first bracket 2 in the upward/downward direction is set to be greater than a total height of supporting portion 3*b*1 and boss portion 3*c* of second bracket 3 in the upward/downward direction.

Moreover, supporting portions 2*b*1 and boss portions 2*c* of first bracket 2 are located between supporting portions 3*b*1 and supporting portions 3*b*2 of second bracket 3. To attain such a state, a space between supporting portion 3*b*1 and supporting portion 3*b*2 of second bracket 3 in the upward/downward direction is set to be greater than a total height of supporting portion 2*b*1 and boss portion 2*c* of first bracket 2 in the upward/downward direction.

From this state, second bracket 3 is moved along an upward direction indicated by an arrow A2 in the drawing.

As shown in FIG. 9, by the movement of second bracket 3 described above in the upward direction, boss portions 2*c* of first bracket 2 are inserted to through holes 3*ba* of second bracket 3 from an upper side and penetrate through through holes 3*ba*. To allow boss portions 2*c* to be inserted to through holes 3*ba*, a diameter of through hole 3*ba* is set to be greater than an outer diameter of boss portion 2*c*.

Moreover, by the movement of second bracket 3 in the upward direction described above, boss portions 3*c* of second bracket 3 are inserted to through holes 2*ba* of first bracket 2 from a lower side and penetrate through through holes 2*ba*. To allow boss portions 3*c* to be inserted to through holes 2*ba*, a diameter of through hole 2*ba* is set to be greater than an outer diameter of boss portion 3*c*.

In this state, an axial line of boss portion 2*c* of first bracket 2 and an axial line of boss portion 3*c* of second bracket 3 are located on the same straight line (B-B line). Boss portion 2*c* of first bracket 2 and boss portion 3*c* of second bracket 3 are arranged to be concentric with each other.

It should be noted that, in this state, although elastic members are arranged between supporting portion 2*b*1 of first bracket 2 and supporting portion 3*b*2 of second bracket 3 and between supporting portion 3*b*1 of second bracket 3 and supporting portion 2*b*2 of first bracket 2, illustration is omitted for ease of description.

Moreover, in this state, boss portion 3*c* of second bracket 3 projects upward from supporting portion 2*b*2 through through hole 2*ba*. Boss portion 2*c* of first bracket 2 projects downward from supporting portion 3*b*2 through through hole 3*ba*.

After that, as shown in FIG. 4, elastic members 4 are fitted to boss portion 3*c* projecting upward from supporting portion 2*b*2. Bolt 6 is screwed to the female screw portion of boss portion 3*c* through washer 5 from above elastic members 4. Accordingly, elastic members 4 are clamped between supporting portion 2*b*2 and supporting portion 3*b*1, and elastic members 4 are clamped between supporting portion 2*b*2 and washer 5, so that supporting portion 3*b*1 is supported with respect to supporting portion 2*b*2 in the upward/downward direction.

Moreover, elastic members 4 are fitted to boss portion 2*c* projecting downward from supporting portion 3*b*2. Bolt 6 is screwed to the female screw portion of boss portion 2*c* through washer 5 from a lower side of elastic members 4. Accordingly, elastic members 4 are clamped between supporting portion 2*b*1 and supporting portion 3*b*2, and elastic members 4 are clamped between supporting portion 3*b*2 and washer 5, so that supporting portion 3*b*2 is supported on supporting portion 2*b*1 in the upward/downward direction.

In the manner as described above, mounting controller assembly 10 to side wall surface 20*c* extending in the upward/downward direction is completed.

Next, the functions and effects of the present embodiment will be described.

According to the present embodiment, as shown in FIG. 4, first bracket 2 is mounted to side wall surface 20*c* extending in the upward/downward direction. Therefore, controller main body 1 can be mounted on side wall surface 20*c* extending in the upward/downward direction through first bracket 2 and second bracket 3.

Moreover, since controller assembly 10 can be mounted on side wall surface 20*c* extending in the upward/downward direction, a large space in the lateral direction (the depth direction and the width direction) can be secured.

Moreover, elastic members 4 support second bracket 3 with respect to first bracket 2 in the upward/downward direction. Therefore, vibrations of second bracket 3 with respect to first bracket 2 in the upward/downward direction can be attenuated effectively.

Moreover, as shown in FIG. 5, elastic members 4 are located in the width direction of the side surface of controller main body 1. Accordingly, the size of controller assembly 10 in the direction orthogonal to side wall surface 20*c* (the depth direction of controller main body 1) extending in the upward/downward direction can be set small. Therefore, even when the space in the direction orthogonal to side wall surface 20*c* described above is small, controller assembly 10 can be arranged in that space.

Moreover, as shown in FIG. 5, boss portions 2*c* of first bracket 2 extend downward from supporting portions 2*b*1 and penetrate through through holes 3*ba*, and boss portions 3*c* of second bracket 3 extend upward from supporting portions 3*b*1 and penetrate through through holes 2*ba* of first bracket 2. Accordingly, by arranging elastic members 4 between boss portions 2*c* and supporting portions 3*b*2, and arranging elastic members 4 between boss portions 3*c* and supporting portions 2*b*2, vibrations in both upward/downward directions can be attenuated effectively.

Moreover, as shown in FIG. 5, boss portions 2*c* extending downward from supporting portions 2*b*1 are located on a lower side than boss portions 3*c*. Accordingly, since boss portions 3*c* are not located on a lower side of boss portions 2*c*, bolt 6 can be readily screwed onto the female screw portion on the lower end surface of boss portion 2*c*. Moreover, boss portions 3*c* extending upward from supporting portions 3*b*1 are located on an upper side than boss portions 2*c*. Accordingly, since boss portions 2*c* are not located on an upper side of boss portions 3*c*, bolt 6 can be readily screwed onto the female screw portion on the upper end surface of boss portion 3*c*. Therefore, controller assembly 10 can be readily assembled.

Moreover, as shown in FIG. 9, boss portion 2*c* and boss portion 3*c* are arranged so as to be concentric with each other. Accordingly, as compared to the case where boss portion 2*c* and boss portion 3*c* are not arranged concentric with each other, the space in the lateral direction (the width direction and the depth direction) can be utilized effectively.

Moreover, as shown in FIG. 4, connector portions 1*c* are arranged at an upper end of main body portion 1*a*. Accordingly, operation of connecting a cable or the like to connector portion 1*c* can be readily performed.

Moreover, as shown in FIG. 4, indicator portion 1*b* is arranged on an upper portion of main body portion 1*a*.

Accordingly, as shown in FIG. 2, in a case where controller assembly 10 is arranged below side window 20ca, an operator can readily view indicator portion 1b.

Moreover, as shown in FIG. 3, height size H of controller main body 1 in the upward/downward direction is less than width size W of controller main body 1. Accordingly, a height of controller assembly 10 can be suppressed, and controller assembly 10 can be readily arranged, for example, below side window 20ca of cab 20.

Moreover, as shown in FIG. 3, width size W of controller main body 1 in the width direction and height size H of controller main body 1 in the upward/downward direction are greater than depth size L of controller main body 1 in the orthogonal direction (depth direction) orthogonal to the wall surface. Accordingly, a large space can be readily secured in the depth direction of controller assembly 10. Moreover, even when a space is small in the direction orthogonal to side wall surface 20c, controller assembly 10 can be arranged in that space.

Moreover, as shown in FIG. 5, when controller main body 1 is viewed from the direction orthogonal to side wall surface 20c, first bracket 2 has wall surface mount holes 2d at positions not overlapping with controller main body 1. Accordingly, controller assembly 10 can be mounted on the wall surface extending in the upward/downward direction after assembling controller assembly 10, so that operability of mounting is improved.

Moreover, as shown in FIG. 6, controller assembly 10 is located at least in region R of operator's seat 20a in the leftward/rightward direction in a plan view. Accordingly, viewing and handling of controller assembly 10 by an operator seated on operator's seat 20a can be readily performed.

Moreover, as shown in FIG. 6, work implement 24 is arranged on one side of cab 20 in the leftward/rightward direction in a plan view, and controller assembly 10 is arranged on the other side of operator's seat 20a in the leftward/rightward direction. Therefore, when determining the shape of side wall surface 20c of cab 20 on the side opposite to the side on which work implement 24 is arranged in a plan view, it would not be necessary to consider interference with work implement 24. Thus, side wall surface 20c of cab 20 can be curved so as to protrude toward the outer space from the internal space of cab 20 in a plan view. Accordingly, the internal space of cab 20 can be extended on the other side of operator's seat 20a in the leftward/rightward direction. Thus, arrangement of controller assembly 10 can be readily performed by arranging controller assembly 10 in the extended space.

It should be noted that, in the embodiment described above, second bracket 3 is supported with respect to first bracket 3 so as to attenuate vibrations in the upward/downward direction by means of vibration suppressing members 4 between supporting portion 2b2 and supporting portions 3b1, vibration suppressing members 4 between supporting portion 2b1 and supporting portion 3b2, and vibration suppressing members 4 between supporting portion 3b2 and washer 5. The configuration of the present invention is not limited to this, and it is all necessary to have a configuration that at least one vibration suppressing member 4 supports first bracket 2 at one end in the upward/downward direction and supports second bracket 3 at the other end in the upward/downward direction.

Moreover, in the description above, boss portions 2c of first bracket 2 extend downward from supporting portions 2b1, and boss portions 3c of second bracket 3 extend upward from supporting portions 3b1, and supporting portions 2b1 are located below supporting portions 3b1. However, the configuration of the present invention is not limited to this configuration, and the configuration shown in FIG. 10 may be employed.

Figure 10:
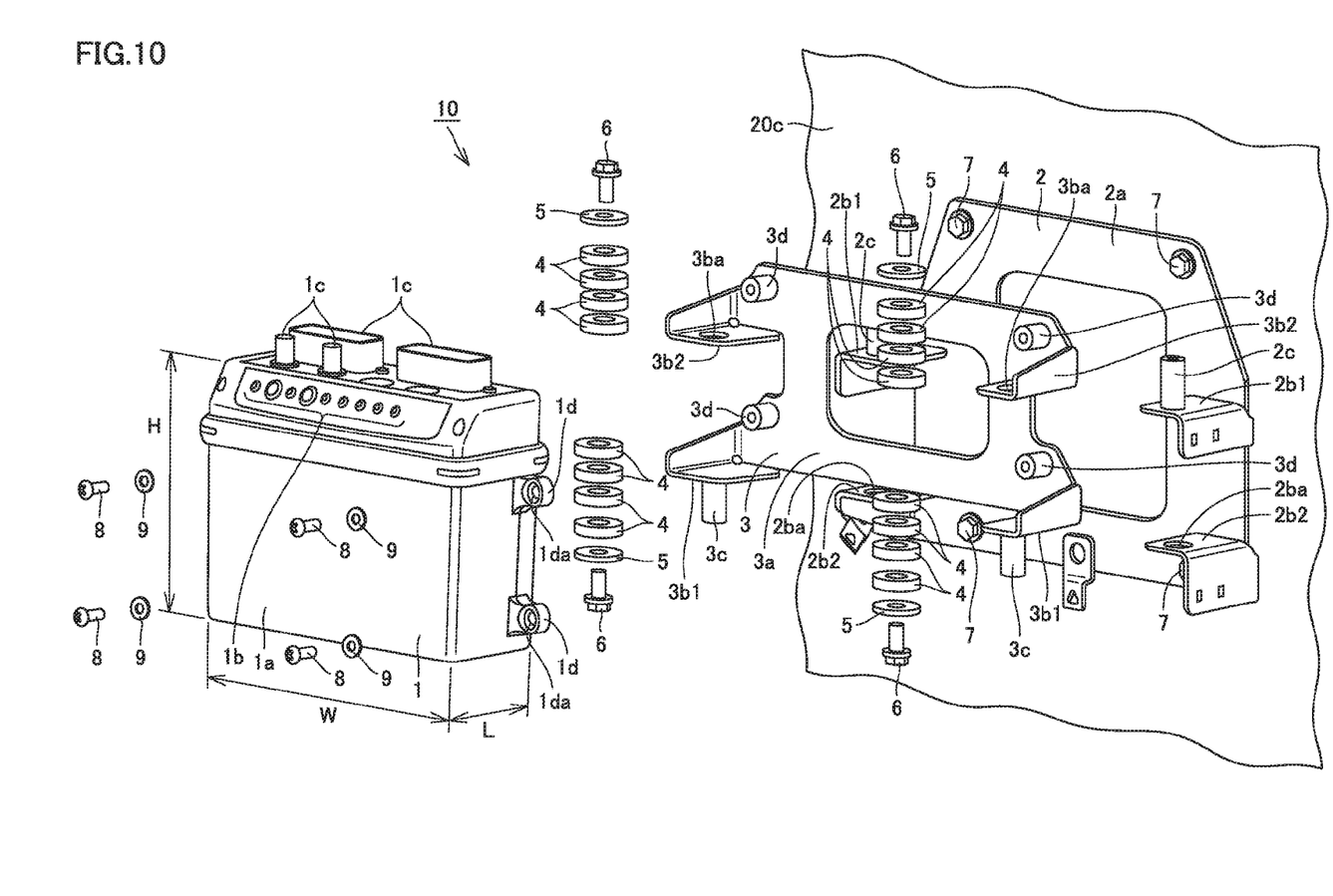
FIG. 10 is an exploded perspective view representing another configuration of the controller assembly in accordance with one embodiment of the present invention.

FIG. 10 is an exploded perspective view representing another configuration of the controller assembly in accordance with one embodiment of the present invention. In the configuration shown in FIG. 10, boss portions 2c of first bracket 2 extend upward from supporting portions 2b1 and penetrate through through holes 3ba of supporting portions 3b2. Boss portions 3c of second bracket 3 extend downward from supporting portions 3b1 and penetrate through through holes 2ba of supporting portions 2b2. Supporting portions 3b1 are located below supporting portions 2b1.

Since the configuration shown in FIG. 10 is substantially the same as the configuration shown in FIG. 3 except for the configuration described above, the same elements have the same reference characters allotted, and description thereof will not be repeated.

Moreover, in the description above, the number of elastic members 4 arranged between supporting portion 3b1 and supporting portion 2b2 is not limited to two, and it may be one, or greater than or equal to three. Moreover, the number of elastic members 4 arranged between supporting portion 2b2 and washer 5 is also not limited to two, and it may be one, or greater than or equal to three. Moreover, the number of elastic members 4 arranged between supporting portion 3b2 and washer 5 is also not limited to two, and it may be one, or greater than or equal to three.

Moreover, although bolt 8 has been described as means for fixing controller main body 1 to fixation portion 3a of second bracket 3 in the description above, this fixing means is not limited to this, and it may be a pin, welding, or the like.

Moreover, in the description above, bolt 7 as means for mounting first bracket 2 to side wall surface 20c and bolt 6 as means for mounting elastic members 4 to boss portion 2c or boss portion 3c are also not limited to the bolt as with the description above, and it may be a pin, welding, or the like.

It should be understood that the embodiment disclosed herein is illustrative and non-restrictive in every respect. The scope of the present invention is defined by the terms of claims, rather than the description of the embodiments set forth above, and is intended to include any modifications within the scope and meaning equivalent to the terms of the claims.

REFERENCE SIGNS LIST 1 controller main body; 1a main body portion; 1b indicator portion; 1c connector portion; 1d projecting fixation portion; 1da, 2ba, 3ba through hole; 2 first bracket; 2a mounting portion; 2b1, 2b2, 3b1, 3b2 supporting portion; 2c, 3c boss portion; 2d wall surface mount hole; 3 second bracket; 3a fixation portion; 3ca female screw portion; 3d projection portion; 4 vibration suppressing member (elastic member); 5, 9 washer; 6, 7, 8 bolt; 10 controller assembly; 20 cab; 20a operator's seat; 20b protective cover; 20ba opening; 20c side wall surface; 20ca side window; 22 travel unit; 22a crawler belt apparatus; 23 revolving unit; 24 work implement; 24a boom; 24b arm; 24c bucket; 24d, 24e, 24f hydraulic cylinder; 26 engine compartment; 27 counterweight; 30 hydraulic excavator.

The invention claimed is:

1. A controller assembly mounted to a wall surface of a work vehicle, the controller assembly comprising:

a controller main body;

a first bracket mounted on the wall surface, the wall surface extending in an upward/downward direction of the work vehicle;

a second bracket fixed to the controller main body; and a vibration suppressing member supporting the first bracket at one end in the upward/downward direction and supporting the second bracket at the other end in the upward/downward direction such that the second bracket is movable with respect to the first bracket.

2. The controller assembly according to claim 1, wherein when a width direction is defined as a direction which is orthogonal to both an orthogonal direction orthogonal to the wall surface and the upward/downward direction, the vibration suppressing member is located in the width direction of the controller main body.

3. The controller assembly according to claim 1, wherein
the first bracket has a first boss portion and a first hole portion, and
the second bracket has a second boss portion and a second hole portion, and
the first boss portion extends toward one side in the upward/downward direction and penetrates through the second hole portion, and
the second boss portion extends toward the other side in the upward/downward direction and penetrates through the first hole portion.

4. The controller assembly according to claim 3, wherein the first boss portion is located more on the one side in the upward/downward direction than the second boss portion, and a first vibration suppressing member fixation portion is provided at an end portion on the one side of the first boss portion, and a second vibration suppressing member fixation portion is provided at an end portion on the other side of the second boss portion.

5. The controller assembly according to claim 3, wherein the first boss portion and the second boss portion are arranged so as to be concentric with each other.

6. The controller assembly according to claim 1, wherein the controller main body includes a main body portion and a connector portion arranged at an upper end of the main body portion.

7. The controller assembly according to claim 1, wherein the controller main body includes a main body portion and an indicator portion arranged on an upper portion of the main body portion.

8. The controller assembly according to claim 1, wherein when a width direction is defined as a direction which is orthogonal to both an orthogonal direction orthogonal to the wall surface and the upward/downward direction, a height size of the controller main body in the upward/downward direction is less than a width size of the controller main body in the width direction.

9. The controller assembly according to claim 1, wherein when a width direction is defined as a direction which is orthogonal to both an orthogonal direction orthogonal to the wall surface and the upward/downward direction, a width size of the controller main body in the width direction and a height size of the controller main body in the upward/downward direction are greater than a depth size of the controller main, body in the orthogonal direction.

10. The controller assembly according to claim 1, wherein when the controller main body is viewed from the orthogonal direction orthogonal to the wall surface, the first bracket has a wall surface mount hole at a position not overlapping with the controller main body.

* * * * *